US012681105B2

(12) United States Patent
Zimmerman

(10) Patent No.: US 12,681,105 B2
(45) Date of Patent: Jul. 14, 2026

(54) MONITORING SELF-DISCHARGE IN OPERATING BATTERY CELLS

(71) Applicant: The Aerospace Corporation, El Segundo, CA (US)

(72) Inventor: Albert Zimmerman, El Segundo, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 866 days.

(21) Appl. No.: 18/067,424

(22) Filed: Dec. 16, 2022

(65) Prior Publication Data

US 2024/0204538 A1 Jun. 20, 2024

(51) Int. Cl.
G01R 31/396 (2019.01)
G01R 31/367 (2019.01)
G01R 31/3835 (2019.01)
G06N 3/0442 (2023.01)
G06N 3/045 (2023.01)

(52) U.S. Cl.
CPC ......... G01R 31/396 (2019.01); G01R 31/367 (2019.01); G01R 31/3835 (2019.01); G06N 3/0442 (2023.01); G06N 3/045 (2023.01)

(58) Field of Classification Search
CPC  G01R 31/396; G01R 31/367; G01R 31/3835; G06N 3/0442; G06N 3/045
See application file for complete search history.

(56) References Cited

U.S. PATENT DOCUMENTS

| | | | | |
|---|---|---|---|---|
| 2016/0099587 A1* | 4/2016 | Becker | .................. | H02J 7/0048 |
| | | | | 320/136 |
| 2022/0128631 A1* | 4/2022 | Zhang | .................... | B60L 58/22 |

FOREIGN PATENT DOCUMENTS

| | | | | |
|---|---|---|---|---|
| CN | 101976876 A | * | 2/2011 | |
| CN | 103378618 A | * | 10/2013 | |
| CN | 110395142 A | * | 11/2019 | .............. B60L 58/22 |

OTHER PUBLICATIONS

Duraisamy et al., "Machine Learning-Based Optimal Cell Balancing Mechanism for Electric Vehicle Battery Management System" IEEE Access vol. 9, 2021 (Year: 2021).*

(Continued)

*Primary Examiner* — John C Kuan
(74) *Attorney, Agent, or Firm* — LeonardPatel PC

(57) ABSTRACT

Monitoring self-discharge in operating battery cells (i.e., actively charging or discharging) is disclosed. Cell voltage data over time is used to detect cell-to-cell charge voltage imbalance in a battery while battery cells are at their peak charge voltage. Resistors across each cell are switched on or off according to the average charge voltage imbalance. Actual resistor on-times are used as input to train a neural network in real time. The neural network learns the resistor duty cycle needed by each battery cell to precisely balance its self-discharge losses. If the self-discharge changes, the neural network retrains itself as the new data arrives. The neural network may include a Long Short-Term Memory (LSTM) network for each cell in the battery, which can learn the relative self-discharge rate of the respective cell.

26 Claims, 10 Drawing Sheets

900

START

Detect Cell Voltages Over Time — 910

Run Detected Voltages through Neural Network — 920

Train Neural Network — 930

Control Resistances for Cells — 940

(56)                    References Cited

OTHER PUBLICATIONS

Jason Brownlee, "A Gentle Introduction to Long Short-Term Memory
Networks by the Experts," available at https://machinelearningmastery.
com/gentle-introduction-long-short-term-memory-networks-
experts/ (May 24, 2017).
Wikipedia Long Short-Term Memory Article available at https://
en.wikipedia.org/wiki/Long_short-term_memory (last accessed Nov.
5, 2022).

* cited by examiner

Figure 2:
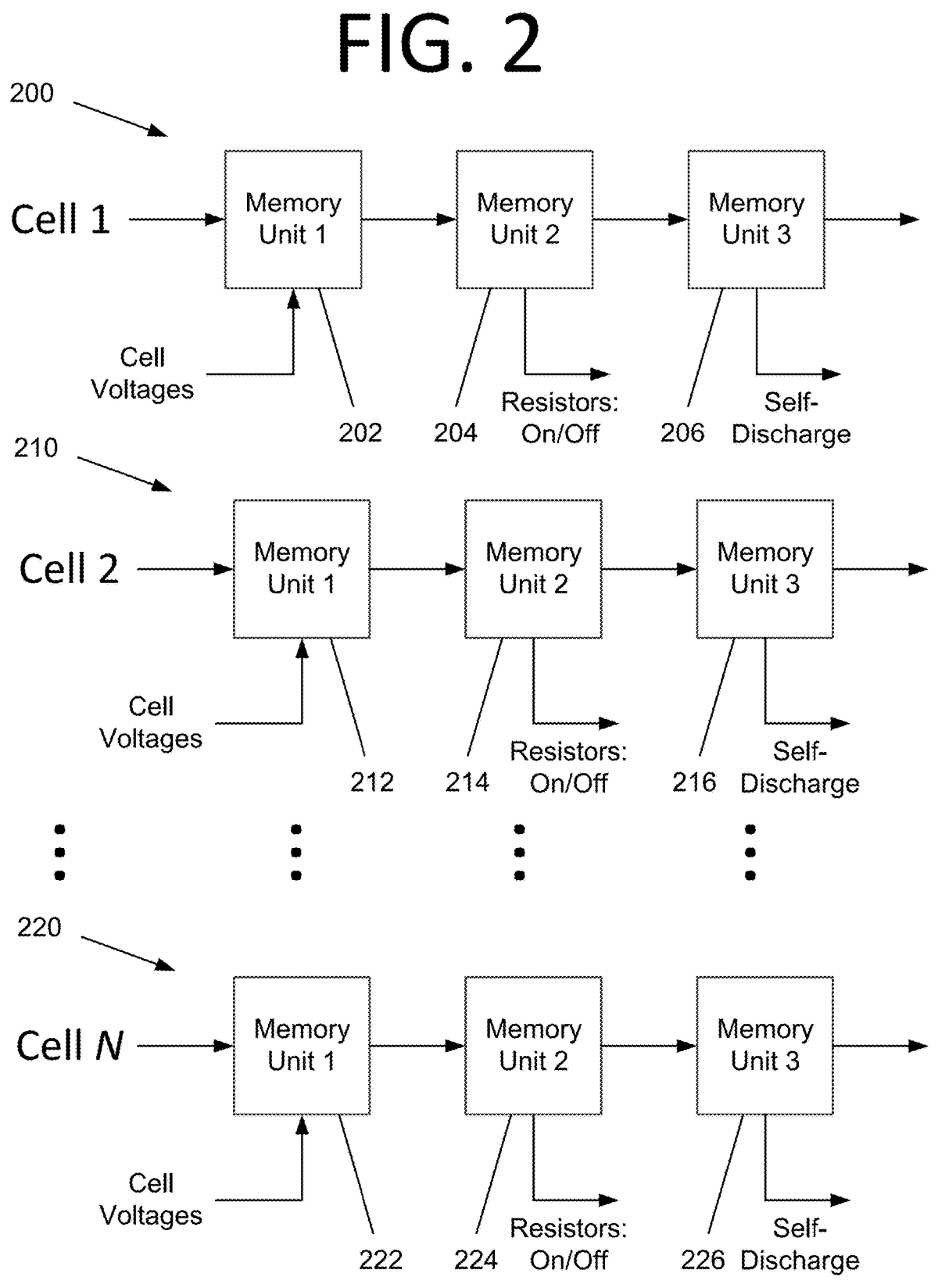

Cell 1 →

| Memory Unit 1 | → | Memory Unit 2 | → | Memory Unit 3 | →

Cell Voltages →

202    204    Resistors: On/Off    206    Self-Discharge

210

Cell 2 →

| Memory Unit 1 | → | Memory Unit 2 | → | Memory Unit 3 | →

Cell Voltages →

212    214    Resistors: On/Off    216    Self-Discharge

⋮    ⋮    ⋮    ⋮    ⋮

220

Cell N →

| Memory Unit 1 | → | Memory Unit 2 | → | Memory Unit 3 | →

Cell Voltages →

222    224    Resistors: On/Off    226    Self-Discharge

300A

NN
302A

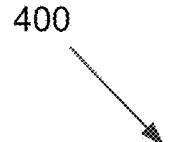
FIG. 4
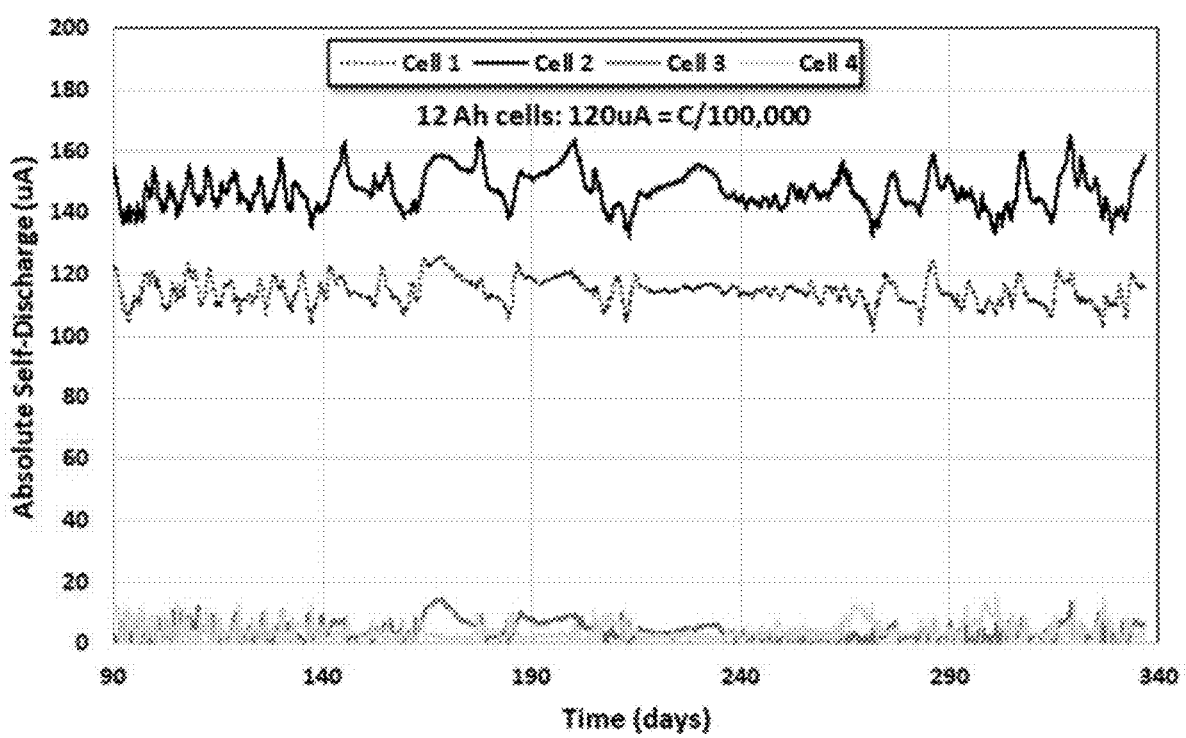

500

600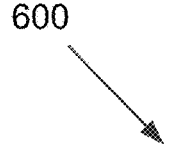
FIG. 6
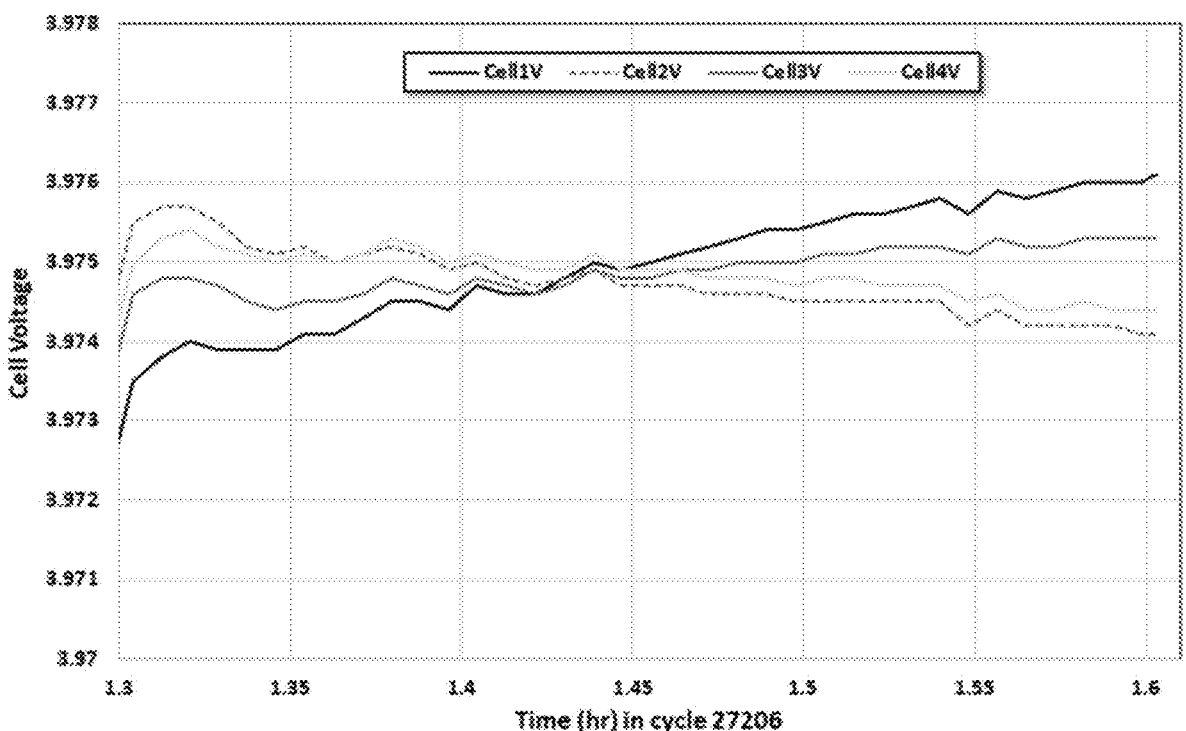

FIG. 8
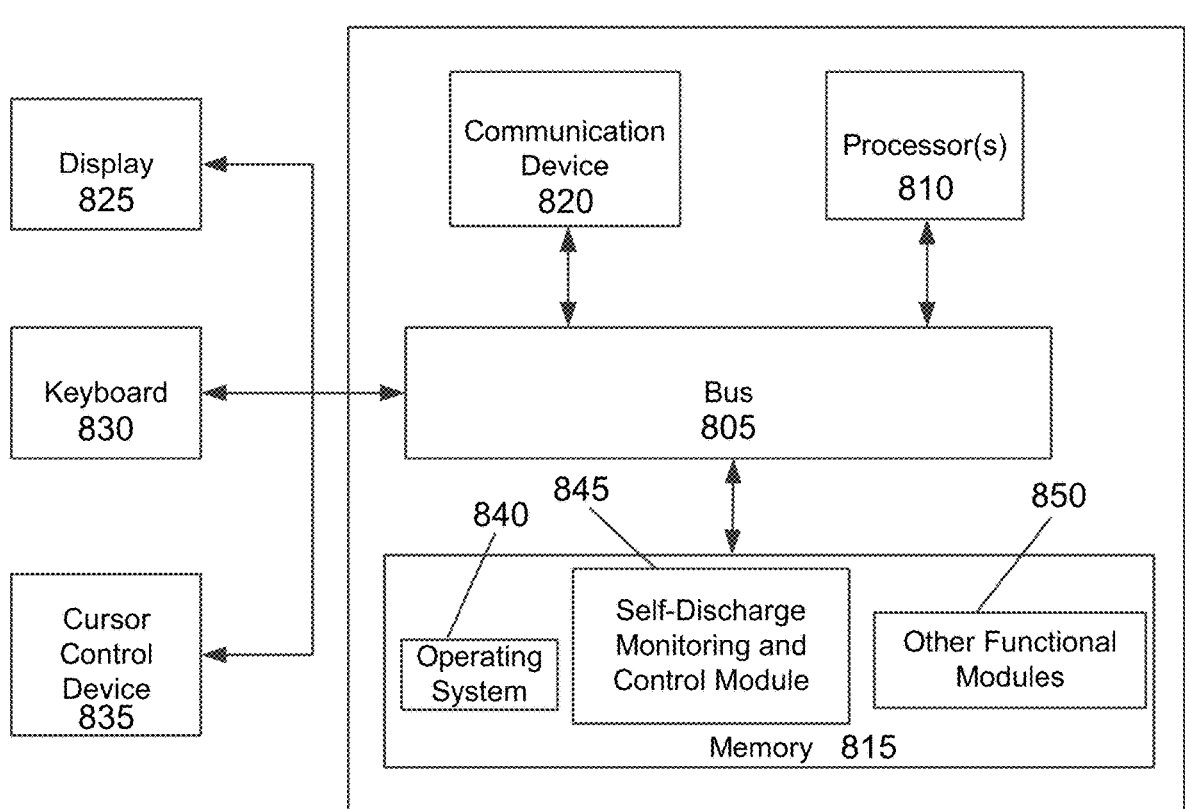

900

MONITORING SELF-DISCHARGE IN OPERATING BATTERY CELLS

FIELD

The present invention generally pertains to batteries, and more particularly, to monitoring self-discharge in operating battery cells.

BACKGROUND

The self-discharge rate of Li-ion battery cells is extremely low (typically microamps), whereas the normal operating currents of the battery cells can be many amperes. Due to the difference of many orders of magnitude (e.g., 5-6) between these values, currently, self-discharge rates of lithium (Li) ion battery cells can only be measured while the battery cells are in an open circuit configuration with no flowing current during long open circuit periods. As such, current self-discharge rate measurement instrumentation cannot provide self-discharge rates while battery cells are in operational use with active current flowing therethrough. Accordingly, an improved and/or alternative solution for battery monitoring may be beneficial.

SUMMARY

Certain embodiments of the present invention may be implemented and provide solutions to the problems and needs in the art that have not yet been fully solved by existing battery technologies. For example, some embodiments pertain to monitoring self-discharge in operating battery cells.

In an embodiment, a battery system includes a battery. The battery includes a plurality of battery cells, each cell having a resistor across the respective cell. The battery system also includes a computing system operably connected to the plurality of battery cells. The computing system includes memory storing computer program instructions for monitoring self-discharge in the battery cells and at least one processor configured to execute the computer program instructions. The computer program instructions are configured to cause the at least one processor to detect cell voltages for the plurality of battery cells over time. The computer program instructions are also configured to cause the at least one processor to run the detected cell voltages through a neural network to detect cell-to-cell charge voltage imbalances between the plurality of battery cells while the plurality of battery cells are at peak charge voltages over a time window. The computer program instructions are further configured to cause the at least one processor to control resistances across the plurality of battery cells to maintain voltage balance between the plurality of battery cells based on output from the neural network by turning respective resistors across the plurality of battery cells on and off based on a difference between a peak voltage of a respective cell and peak voltages of other battery cells of the plurality of battery cells.

In another embodiment, a computer-implemented method includes detecting cell voltages for a plurality of battery cells over time, by a computing system. The computer-implemented method also includes running the detected cell voltages through a neural network to detect cell-to-cell charge voltage imbalances between the plurality of battery cells while the plurality of battery cells are at peak charge voltages over a time window, by the computing system. The computer-implemented method further includes controlling resistances across the plurality of battery cells to maintain voltage balance between the plurality of battery cells based on output from the neural network by turning respective resistors across the plurality of battery cells on and off based on a difference between a peak voltage of a respective cell and peak voltages of other battery cells of the plurality of battery cells, by the computing system.

In yet another embodiment, a non-transitory computer-readable medium stores a computer program. The computer program is configured to cause at least one processor to detect cell voltages for a plurality of battery cells over time and run the detected cell voltages through a neural network including a Long Short-Term Memory (LSTM) network for each battery cell of the plurality of battery cells. The LSTM network is configured to learn a relative self-discharge rate of the respective battery cell. The computer program is also configured to cause at least one processor to control resistances across the plurality of battery cells to maintain voltage balance between the plurality of battery cells based on output from the neural network by turning respective resistors across the plurality of battery cells on and off based on a difference between a peak voltage of a respective cell and peak voltages of other battery cells of the plurality of battery cells.

In still another embodiment, a computing system includes memory storing computer program instructions and at least one processor configured to execute the stored computer program instructions. The computer program instructions are configured to cause the at least one processor to train a neural network by running detected cell voltages of a plurality of battery cells through the neural network. The neural network includes an LSTM network for each battery cell of the plurality of battery cells. The LSTM network is configured to learn a relative self-discharge rate of the respective battery cell. Each LSTM network includes three LSTM neural network units.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 2 illustrates a series of battery cells with respective LSTM networks, according to an embodiment of the present invention.

FIG. 4 is a graph illustrating absolute self-discharge in microamps (μA) over time measured for a four cell, 12 amp-hour (Ah) battery employing a self-discharge monitoring algorithm, according to an embodiment of the present invention.

FIG. 6 is a graph illustrating battery cell voltage over time after the self-discharge monitoring algorithm learned the duty cycle for balancing each battery cell during the voltage portion of the recharge cycle, according to an embodiment of the present invention.

FIG. 8 is an architectural diagram illustrating a computing system configured to monitor self-discharge in operating battery cells, according to an embodiment of the present invention.

Unless otherwise indicated, similar reference characters denote corresponding features consistently throughout the attached drawings.

DETAILED DESCRIPTION OF THE EMBODIMENTS

Figure 1:
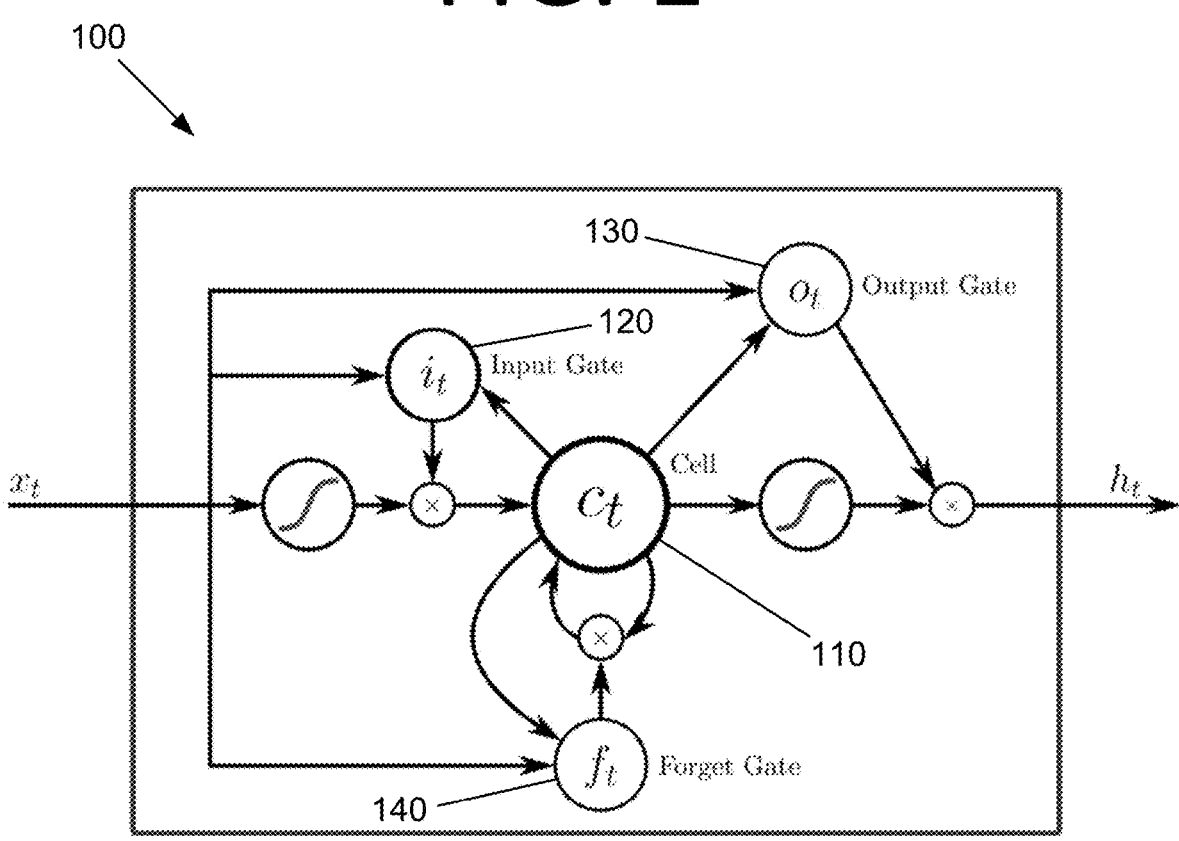
FIG. 1 illustrates a Long Short-Term Memory (LSTM) neural network unit.

Some embodiments of the present invention pertain to monitoring self-discharge in operating battery cells. Per the above, the self-discharge rate of Li-ion cells is extremely low (typically microamps), while the normal operating currents of the battery cells can be many amperes, making it normally impossible to measure the self-discharge rate of Li-ion cells while they are operating using current techniques. Also, self-discharge rates during active charging or discharging of the battery cells is likely different from that during a long open circuit period because the solid electrolyte interphase (SEI) layers are likely less passivating during active cycling.

The self-discharge rate of a battery cell and any changes that it may undergo over time can prove useful for cell matching data and diagnostic and trending information, such as determining trending degradation rates. Also, such information may be used for estimating battery life and reliability. Furthermore, this information (e.g., if sudden increases in self-discharge occur) could serve as a precursor warning of impending battery cell failure. Additionally, a smart balancing algorithm could adapt to changes in the sell self-discharge rates as the battery ages.

Self-discharge data could also be used to provide insight into failure and degradation modes and could be included in models. Furthermore, other advantageous features are possible, including, but not limited to: (1) monitoring the magnitude and variance of self-discharge for new or existing battery technologies as part of life test protocols; (2) providing a new metric for battery cell degradation as batteries age; (3) Determining the variation of self-discharge on charge voltage level during operation, which provides an indication of potential cell imbalance issues with new technologies and can help explain performance trends for existing cell technologies; and (4) suggesting ways to improve the management of batteries by allowing improved operating conditions with very low or unchanging self-discharge to be identified and/or enabling potential faults to be detected early enough to enable mitigation to be enacted. As such, it may be advantageous to be able to measure such information during actual battery operation.

Some embodiments have various applications. For instance, enhanced testing capabilities could be provided for facilities that test and evaluate battery performance and life, including improved assessment of new technologies. These facilities include, but are not limited to, commercial battery cell or battery test equipment suppliers, The Aerospace Corporation®, national laboratories, universities, military facilities, etc. Systems in which such batteries may be deployed include, but are not limited to, cell phones, laptop computers and tablets, cars, aircraft, spacecraft, ships, etc.

Automated detection of precursor signatures could indicate potential unsafe conditions or failures in fielded batteries, whether in terrestrial or space applications. For example, advanced orbital or ground fault management systems may utilize such automated detection capabilities. These capabilities may also enable more intelligent mitigation responses, such as turning off a cell phone and giving a battery anomaly warning before the battery goes into thermal runaway. Smart cell balancers could also be provided that can non-linearly respond to sudden changes in battery cells to maintain cell-to-cell balance.

Battery cell voltage data over time may be used to detect cell-to-cell charge voltage imbalance in a battery while cells are at their peak charge voltage. The charge voltage imbalance can indicate self-discharge integrated over time and maintaining battery cell balance is critical for optimum battery life and safe battery operation. In some embodiments, the algorithm looks at voltage over a time window (e.g., 20-30 minutes) to detect a peak charge signal, where battery cell voltages are periodically updated (e.g., every second, every five seconds, every minute, etc.). However, any desired battery cell voltage measurement interval and time window may be used without deviating from the scope of the invention. The algorithm turns on resistor discharge for higher voltage cells (the resistor discharge rate is in $\mu A$). The on-time target for each resistor may be proportional to how much higher its cell voltage is than the other battery cells.

Actual on-times may be used as input to train a neural network in real time. The neural network learns the resistor duty cycle of each battery cell to precisely balance its self-discharge losses. The resistor duty cycle is inversely proportional to the battery cell self-discharge rate. If the self-discharge changes, the neural network retrains itself as the new data arrives.

Some embodiments are applicable to larger batteries with multiple packs and strings of battery cells, where each battery cell has its own voltage measurement. Each string of series-connected battery cells may have its own neural network algorithm. As many algorithms run as there are strings of series-connected battery cells in such a battery system in some embodiments. These strings may be connected to one another in parallel. Each neural network may output the self-discharge rate for its battery cells, which can be saved and displayed to the user versus time in some embodiments. The self-discharge rates can be calibrated by switching a known resistor across individual battery cells.

Per the above, using current monitoring techniques, the voltage imbalance is only unambiguous at full charge and during open circuit, and it has not been previously possible to actively monitor self-discharge while Li-ion batteries are operating. In order to address the difficulty in measuring self-discharge rates of operating batteries, some embodiments utilize a Long Short-Term Memory (LSTM) neural network for each cell in the battery, which can learn the relative self-discharge rate of the respective cell. However, it should be noted that any suitable RNN may be used without deviating from the scope of the invention. RNNs include a feedback loop that serves as a kind of long-term memory. Thus, the past inputs to the neural net leave a footprint. However, LSTM may be preferred for some embodiments since it extends this concept by creating both a short-term and a long-term memory component.

LSTM neural networks are a type of Recurrent Neural Network (RNN) capable of learning order dependence in sequence prediction problems. RNNs are different from traditional feed-forward neural networks. RNNs have an internal state that can represent context information. They store information pertaining to past inputs for an amount of time that is not fixed a priori, but rather, depends on its weights and the input data. An RNN whose inputs are not fixed, but instead constitute an input sequence, can be used to transform an input sequence into an output sequence while taking into account contextual information in a flexible way. Generally speaking, the RNN should: (1) be able to store information for an arbitrary duration; (2) be resistant to noise (i.e. fluctuations of the inputs that are random or irrelevant to predicting a correct output); and (2) have system parameters that are trainable in a reasonable amount of time.

RNNs contain cycles that feed the network activations from a previous time step as inputs to the network to influence predictions at the current time step. These activations are stored in the internal states of the network, which can, in principle, hold long-term temporal contextual information. This mechanism allows RNNs to exploit a dynamically changing contextual window over the input sequence history.

LSTM has feedback connections, per the above, and can process not only single data points, such as images, but also entire sequences of data, such as speech, video, battery cell self-discharge history, etc. For example, LSTM is applicable to tasks such as unsegmented, connected handwriting recognition, speech recognition, machine translation, robot control, video games, and healthcare. The name of LSTM refers to the analogy that a standard RNN has both "long-term memory" and "short-term memory". The connection weights and biases in the network change once per episode of training, and the activation patterns in the network change once per time-step. The LSTM architecture aims to provide a short-term memory for RNN that can last thousands of timesteps, hence the name "long short-term memory".

An LSTM neural network unit 100 is commonly composed of a cell 110 (also called an "LSTM cell" herein), an input gate 120, an output gate 130, and a forget gate 140. See FIG. 1. Cell 110 remembers values over arbitrary time intervals. Gates 120, 130, 140 regulate the flow of information into and out of cell 110.

LSTM networks are well-suited to classifying, processing, and making predictions based on time series data since there can be lags of unknown duration between important events in a time series. LSTMs were developed to deal with the vanishing gradient problem that can be encountered when training traditional RNNs. Relative insensitivity to gap length is an advantage of LSTM over traditional RNNs, hidden Markov models, and other sequence learning methods in numerous applications.

The algorithm of some embodiments employs a neural network, incorporating LSTM networks in some embodiments, to learn the self-discharge rate by learning the duty cycle needed to keep a resistive load to keep the self-discharge rate of each battery cell precisely matched. The algorithm utilizes a stream of periodically updated battery cell voltage measurements. Learning by the algorithm is based on the deviation of each battery cell voltage from the average battery string voltage during recharge at the full-charge voltage level.

The LSTM network for each cell utilizes three LSTM memory units in some embodiments. FIG. 2 illustrates a series of battery cells 1, 2, . . . , N with respective LSTM networks 200, 210, 220, according to an embodiment of the present invention. Each LSTM network 200, 210, 220 has three memory units. A first memory unit 202, 212, 222 learns the present deviation of the battery cell voltage from the average over an interval (e.g., 15-30 minutes). The battery cell voltages may be provided from a standard telemetry stream of battery cell voltages from the cells in the battery in some embodiments (e.g., from battery cells connected in series, in parallel, or a combination thereof). The output of first memory unit 202, 212, 222 is the present deviation from the average voltage.

A second memory unit 204, 214, 224 determines the duration that the load resistor should be kept on to minimize its deviation from the average and turns the battery cell resistive load on or off appropriately. The output of second memory unit 204, 214, 224 is the actual resistor on and off times. A third memory unit 206, 216, 226 learns the long-term duty cycle needed to precisely match the self-discharge for all the cells in the battery, which is inversely proportional to the relative battery cell self-discharge rate. The output of third memory unit 206, 216, 226 is the learned resistor duty cycle. The neural network state vector passes through all three memory units for each cell, and is recurrently sent back for another pass when new measured voltage data is available. Each of these memory units in some embodiments utilizes a forget gate, an input gate, and an output gate to recognize when the battery cell is at the full-charge voltage, learn the average voltage deviations, turn the load resistors on or off as needed, and remember the average duty cycle and the average battery cell voltage while the load resistors are on. In some embodiments the memory units of FIG. 2 may have the architecture of LSTM neural network unit 100 of FIG. 1.

The algorithm is provided with constant voltage (CV) charging and peak recharge voltages, resistor sizing, cell capacity, the number of cells in the string, how to obtain cell voltages, and how to turn the resistors on and off. Each cell string in the battery is provided with its own algorithm looking at its cells in some embodiments. For example, such an algorithm may use the LabVIEW® graphical programming language, which is data stream driven, and the operations on the data may be represented as graphical modes. An array of neural network state vectors for a string of cells may be updated based on the incoming data flow in a graphical node. In addition to the neural network state vector array, this node includes data inputs and the trained self-discharge and resistor on/off states for each cell in the string. It should be noted, however, that the algorithm could be readily implemented in other code-driven programming environments or in any desired/suitable programming language without deviating from the scope of the invention.

Resistor on times are based on voltage imbalance, duty cycles, resistance, and cell capacity. Duty cycles are learned over a period of time (e.g., up to a week). The optimum solution in the neural network for each string, which may serve as the reward function for training, corresponds to zero duty cycle for the battery cell having the highest self-discharge.

Absolute self-discharge rates for battery cells can be obtained from the algorithm in some embodiments by occasionally calibrating as needed or desired. Calibration may be performed by turning a fixed resistor on for the battery cell with the lowest self-discharge rate to give an expected increase in its self-discharge. The algorithm is allowed to determine the stabilized increase observed, and the offset between the expected and observed changes provides an offset correction to provide absolute self-discharge rates for all the battery cells. An added useful and practical side effect of the operation of the algorithm of some embodiments is that it keeps all of the cells in a battery balanced at their full charge voltage level.

Figure 3A:
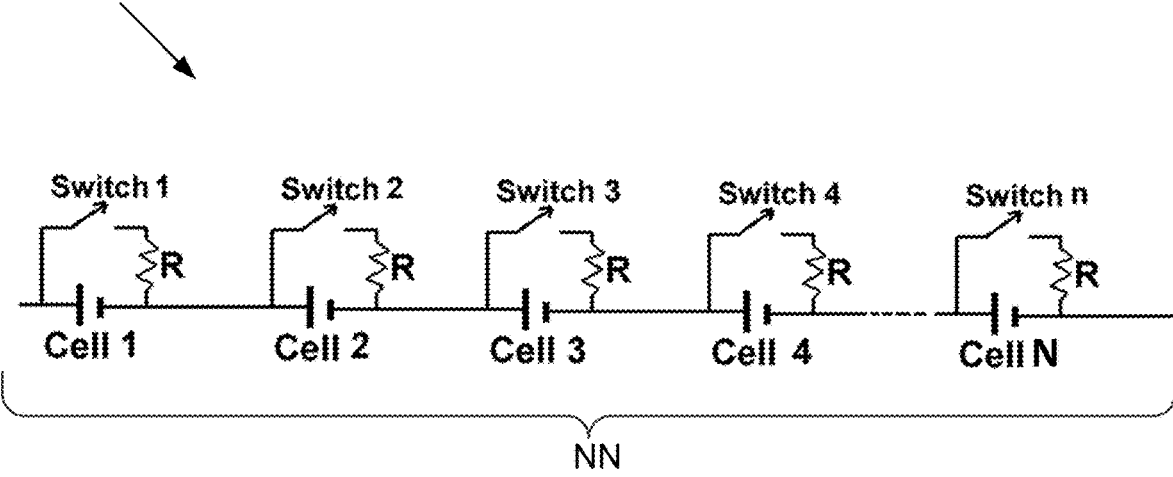
FIG. 3A illustrates cells of a battery connected in series in a single string, according to an embodiment of the present invention.

One way to rebalance battery cells when they self-discharge is to switch resistors across the battery cells that tend to go higher in voltage. FIG. 3A shows cells 1, 2, 3, 4, . . . , N of cell string 300. Cells 1, 2, 3, 4, . . . , N are connected in series and monitored by neural network 302A. A respective switch for a respective battery cell electrically connects its respective resistor in the circuit when switched on. The relative self-discharge rate for each battery cell is inversely proportional to its duty cycle, and each resistor may be configured to pass a current several times the maximum expected battery cell self-discharge rate, which is typically well below 1 milliamp. The employed machine learning algorithm of neural network 302A, such as the LSTM algorithm discussed above, learns the duty cycle for switching resistors across battery cells to precisely balance their self-discharge.

Figure 3B:
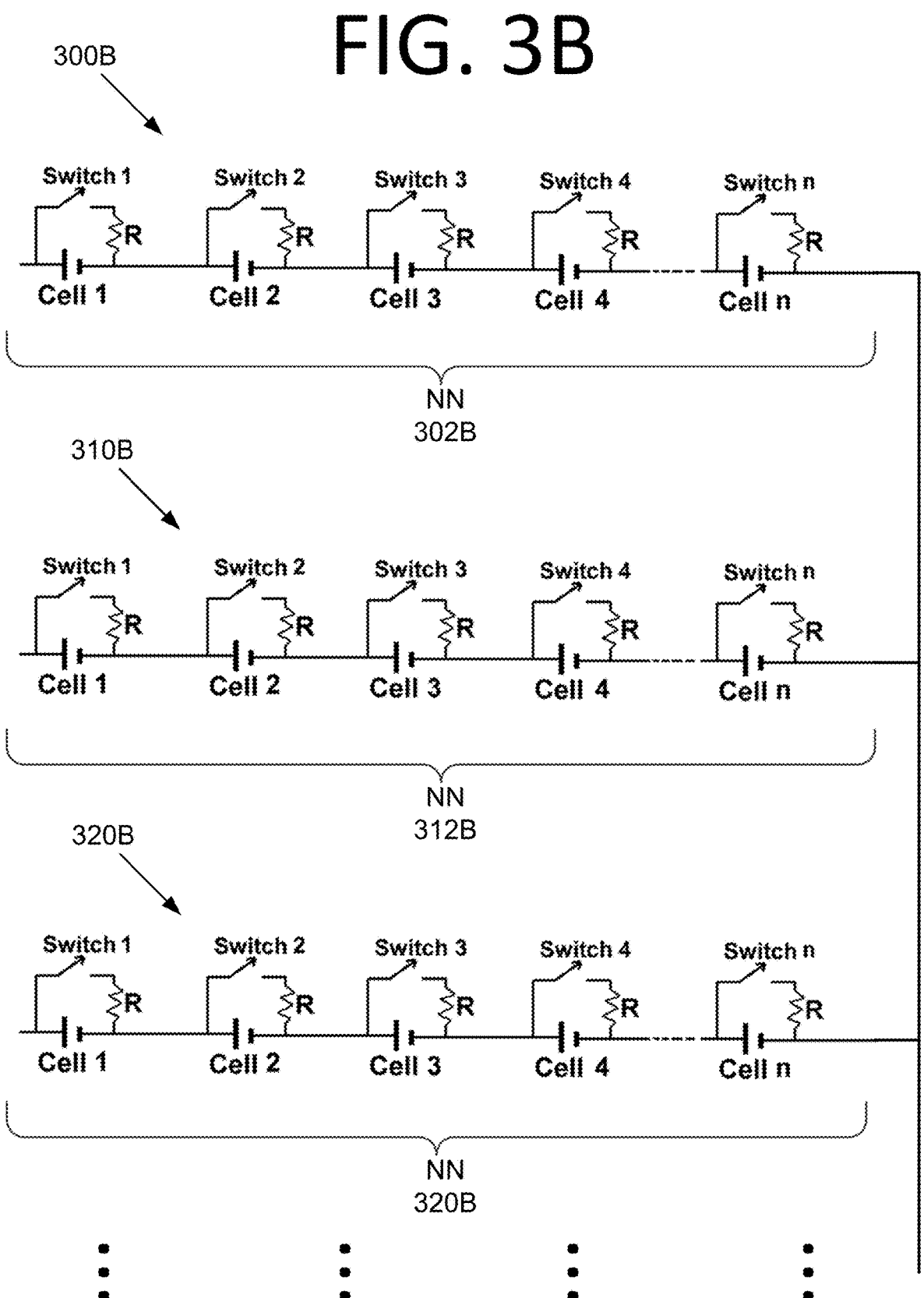
FIG. 3B illustrates multiple strings of series battery cells that are connected to one another in parallel, according to an embodiment of the present invention.

In some embodiments, multiple series connected strings of battery cells are connected to one another in parallel. FIG. 3B shows such an embodiment. Series connected battery cell strings 300B, 310B, 320B have their own neural networks 302B, 312B, 322B. Neural networks 302B, 312B, 322B learn the self-discharge characteristics of their respective battery cell strings and control connections to respective resistors for each battery cell via respective switches.

Various applications are possible for the self-discharge monitoring algorithms and systems of some embodiments. These applications include, but are not limited to, battery cell monitoring in space (e.g., spacecraft, satellites, rovers, space stations, etc.), e-bikes, automobiles, drones, aircraft, consumer electronics (e.g., smart phones, laptop computers, tablets, and the like), etc. Monitoring of degradation signatures or trends in batteries may be performed, data may be obtained for matching battery cells when making batteries, monitoring for precursor signatures warning of impending failure may be performed, etc.

Figure 5:
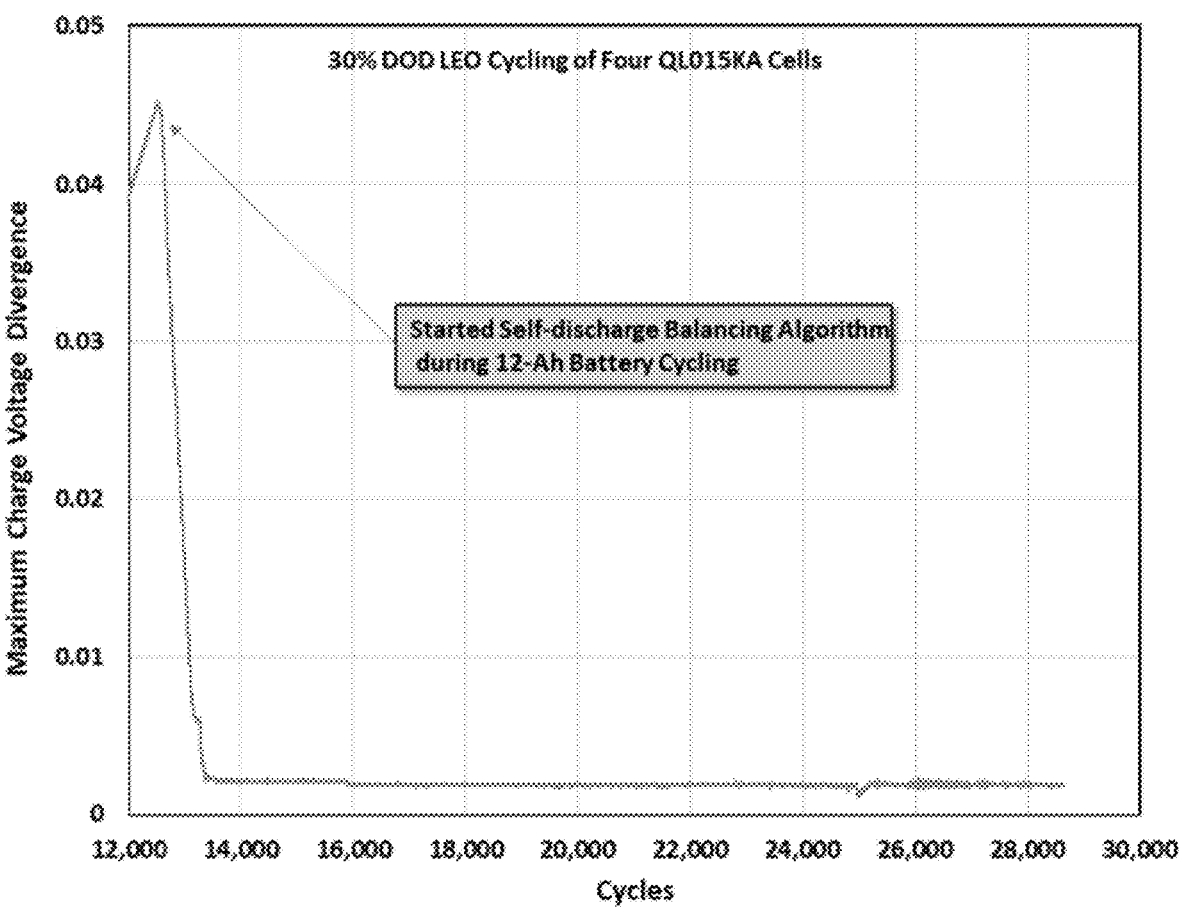
FIG. 5 is a graph illustrating maximum cell-to-cell charge voltage divergence (imbalance) over time (i.e., from 12,000 to ~29,000 cycles), according to an embodiment of the present invention.

FIG. 4 is a graph 400 illustrating absolute self-discharge in microamps (μA) over time measured for a four cell, 12 amp-hour (Ah) battery employing a self-discharge monitoring algorithm, according to an embodiment of the present invention. Graph 500 of FIG. 5 shows maximum cell-to-cell voltage imbalance over a large number of cycles, according to an embodiment of the present invention. The battery operated in a 30% depth-of-discharge (DoD) low Earth orbit (LEO) profile with 15 charge and discharge cycles per day. The algorithm in this embodiment used normal housekeeping voltage telemetry from a test station and switchable 5 kiloohm (Kohm) resistors on each battery cell. The resistor may be sized appropriately for the battery cell using traditional cell self-discharge measurement techniques prior to training the neural network algorithm in some embodiments. It should be noted that this initial resistor sizing is not part of the training. Algorithm development and calibration occurred during the first 90 days, and the rates held constant for two months thereafter with some temperature-induced variations. The calibration was based on the response of the battery cell having the highest duty cycle (i.e., the lowest self-discharge) to known artificial self-discharge from a 50 Kohm resistor.

FIG. 6 is a graph 600 illustrating battery cell voltage over time after the self-discharge monitoring algorithm learned the duty cycle for balancing each battery cell during the voltage portion of the recharge cycle, according to an embodiment of the present invention. The cell-to-cell variations from the average voltage towards the end of the time in the cycle are due to slightly different internal battery cell resistances. The algorithm of some embodiments could be used as a smart cell balancer in a battery having cell resistors.

Figure 7:
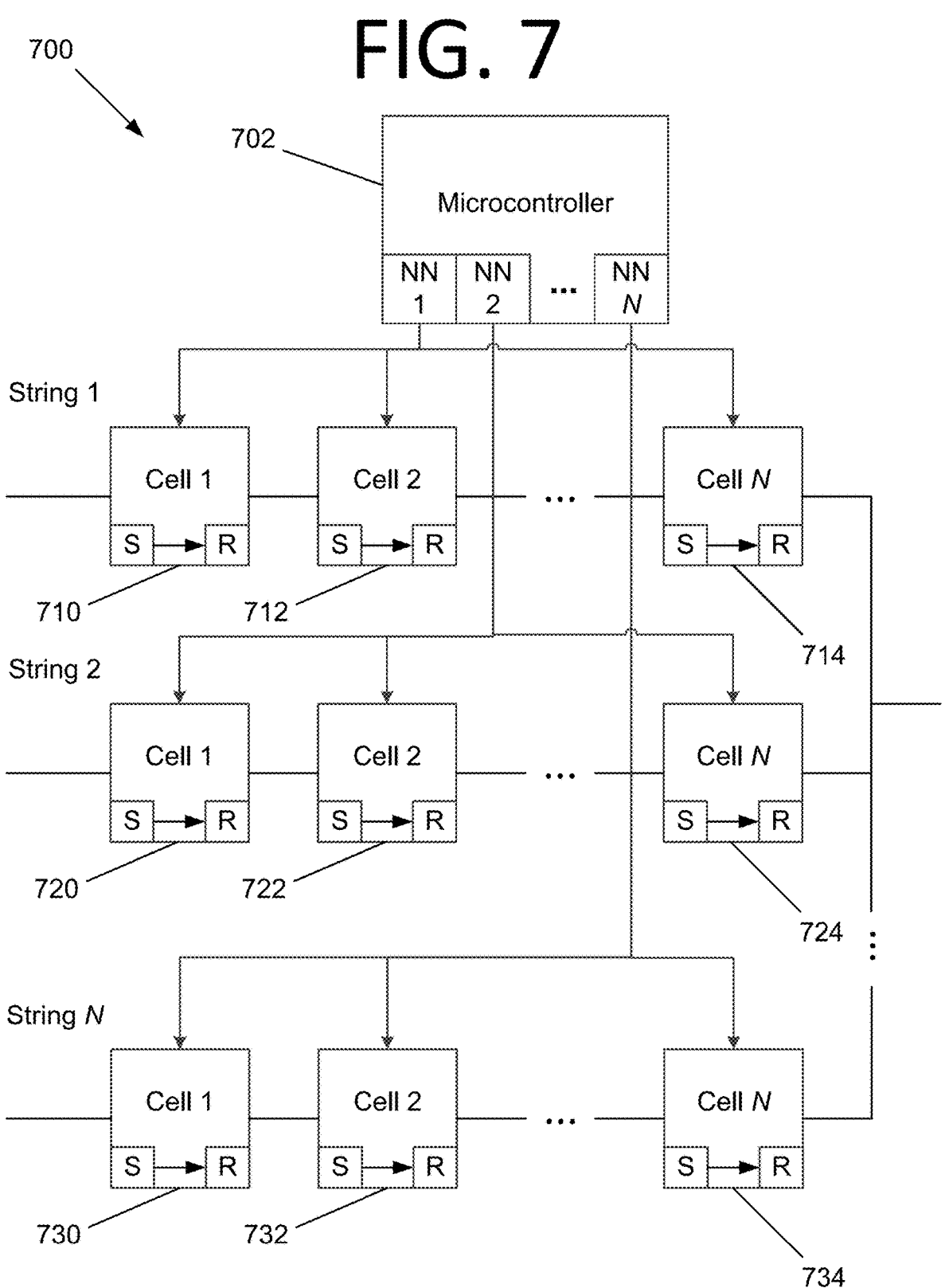
FIG. 7 is an architectural diagram illustrating a battery system with multiple strings of series connected battery cells that are connected to one another in parallel, according to an embodiment of the present invention.

FIG. 7 is an architectural diagram illustrating a battery system 700 with multiple strings of series connected battery cells, according to an embodiment of the present invention. Battery system 700 includes a microcontroller 702 (or any other suitable computing system for the given application, such as a flight computer, a cell phone processor, automotive control processor, avionics systems, etc.—see FIG. 8, for example) with neural networks NN 1, NN 2, . . . , NN N for respective strings 1, 2, . . . , N. NN 1 controls respective switches S for connecting respective resistors R for cell 1 710, cell 2 712, . . . , cell N 714 of string 1, NN 2 controls respective switches S for connecting respective resistors R for cell 1 720, cell 2 722, . . . , cell N 724 of string 2, and NN N controls respective switches S for connecting respective resistors R for cell 1 730, cell 2 732, . . . , cell N 734 of string N. It should be noted that while the series connected cell strings are shown as having N cell each, any desired number of cells may be used in each string without deviating from the scope of the invention. It should also be noted that while the resistors and switches are shown as being a part of the battery cells in FIG. 7, these elements would be physically external to the cells in typical embodiments, but would typically be internal to the battery itself.

In some embodiments, NN 1, NN 2, . . . , NN N employ three LSTM neural network units for each battery cell in their respective strings in the manner discussed above with respect to FIG. 2. Microcontroller 702 may directly control stitches of the battery cells or may interact with control electronics (not shown) of the respective battery cells that control the switches. System 700 may be deployed in any suitable system where monitoring of battery cell self-discharge and control of the resistances thereof are desired.

FIG. 8 is an architectural diagram illustrating a computing system configured to monitor self-discharge in operating battery cells, according to an embodiment of the present invention. In some embodiments, computing system 800 may be one or more of the computing systems depicted and/or described herein, such as a computing system or controller for a vehicle (e.g., terrestrial vehicles, spacecraft, or aircraft), smart phones, laptop computers, tablets, etc. Computing system 800 includes a bus 805 or other communication mechanism for communicating information, and processor(s) 810 coupled to bus 805 for processing information. Processor(s) 810 may be any type of general or specific purpose processor, including a Central Processing Unit (CPU), an Application Specific Integrated Circuit (ASIC), a Field Programmable Gate Array (FPGA), a Graphics Processing Unit (GPU), multiple instances thereof, and/or any combination thereof. Processor(s) 810 may also have multiple processing cores, and at least some of the cores may be configured to perform specific functions. Multi-parallel processing may be used in some embodiments. In certain embodiments, at least one of processor(s) 810 may be a neuromorphic circuit that includes processing elements that mimic biological neurons. In some embodiments, neuromorphic circuits may not require the typical components of a Von Neumann computing architecture.

Computing system 800 further includes a memory 815 for storing information and instructions to be executed by processor(s) 810. Memory 815 can be comprised of any combination of random access memory (RAM), read-only memory (ROM), flash memory, cache, static storage such as a magnetic or optical disk, or any other types of non-transitory computer-readable media or combinations thereof. Non-transitory computer-readable media may be any available media that can be accessed by processor(s) 810 and may include volatile media, non-volatile media, or both. The media may also be removable, non-removable, or both.

Additionally, computing system 800 includes a communication device 820, such as a transceiver, to provide access to a communications network via a wireless and/or wired connection. In some embodiments, communication device 820 may be configured to use Frequency Division Multiple Access (FDMA), Single Carrier FDMA (SC-FDMA), Time Division Multiple Access (TDMA), Code Division Multiple Access (CDMA), Orthogonal Frequency Division Multiplexing (OFDM), Orthogonal Frequency Division Multiple Access (OFDMA), Global System for Mobile (GSM) communications, General Packet Radio Service (GPRS), Universal Mobile Telecommunications System (UMTS), cdma2000, Wideband CDMA (W-CDMA), High-Speed Downlink Packet Access (HSDPA), High-Speed Uplink Packet Access (HSUPA), High-Speed Packet Access (HSPA), Long Term Evolution (LTE), LTE Advanced (LTE-A), 802.11x, Wi-Fi, Zigbee, Ultra-WideBand (UWB), 802.16x, 802.15, Home Node-B (HnB), Bluetooth, Radio Frequency Identification (RFID), Infrared Data Association (IrDA), Near-Field Communications (NFC), fifth generation (5G), New Radio (NR), any combination thereof, and/or any other currently existing or future-implemented communications standard and/or protocol without deviating from the scope of the invention. In some embodiments, communication device 820 may include one or more antennas that are singular, arrayed, phased, switched, beamforming, beam-steering, a combination thereof, and or any other antenna configuration without deviating from the scope of the invention.

Processor(s) 810 are further coupled via bus 805 to a display 825, such as a plasma display, a Liquid Crystal Display (LCD), a Light Emitting Diode (LED) display, a Field Emission Display (FED), an Organic Light Emitting Diode (OLED) display, a flexible OLED display, a flexible substrate display, a projection display, a 4K display, a high definition display, a Retina® display, an In-Plane Switching (IPS) display, or any other suitable display for displaying information to a user. Display 825 may be configured as a touch (haptic) display, a three-dimensional (3D) touch display, a multi-input touch display, a multi-touch display, etc. using resistive, capacitive, surface-acoustic wave (SAW) capacitive, infrared, optical imaging, dispersive signal technology, acoustic pulse recognition, frustrated total internal reflection, etc. Any suitable display device and haptic I/O may be used without deviating from the scope of the invention.

A keyboard 830 and a cursor control device 835, such as a computer mouse, a touchpad, etc., are further coupled to bus 805 to enable a user to interface with computing system 800. However, in certain embodiments, a physical keyboard and mouse may not be present, and the user may interact with the device solely through display 825 and/or a touchpad (not shown). Any type and combination of input devices may be used as a matter of design choice. In certain embodiments, no physical input device and/or display is present. For instance, the user may interact with computing system 800 remotely via another computing system in communication therewith, or computing system 800 may operate autonomously.

Memory 815 stores software modules that provide functionality when executed by processor(s) 810. The modules include an operating system 840 for computing system 800. The modules further include a self-discharge monitoring and control module 845 that is configured to perform all or part of the processes described herein or derivatives thereof. Computing system 800 may include one or more additional functional modules 850 that include additional functionality.

One skilled in the art will appreciate that a "computing system" could be embodied as a server, an embedded computing system, a personal computer, a console, a personal digital assistant (PDA), a cell phone, a tablet computing device, a quantum computing system, a computing system of a vehicle (whether manned or autonomous) or any other suitable computing device, or combination of devices without deviating from the scope of the invention. Presenting the above-described functions as being performed by a "system" is not intended to limit the scope of the present invention in any way, but is intended to provide one example of the many embodiments of the present invention. Indeed, methods, systems, and apparatuses disclosed herein may be implemented in localized and distributed forms consistent with computing technology, including cloud computing systems. The computing system could be part of or otherwise accessible by a local area network (LAN), a mobile communications network, a satellite communications network, the Internet, a public or private cloud, a hybrid cloud, a server farm, any combination thereof, etc. Any localized or distributed architecture may be used without deviating from the scope of the invention.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, include one or more physical or logical blocks of computer instructions that may, for instance, be organized as an object, procedure, or function. Nevertheless, the executables of an identified module need not be physically located together, but may include disparate instructions stored in different locations that, when joined logically together, comprise the module and achieve the stated purpose for the module. Further, modules may be stored on a computer-readable medium, which may be, for instance, a hard disk drive, flash device, RAM, tape, and/or any other such non-transitory computer-readable medium used to store data without deviating from the scope of the invention.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 9:
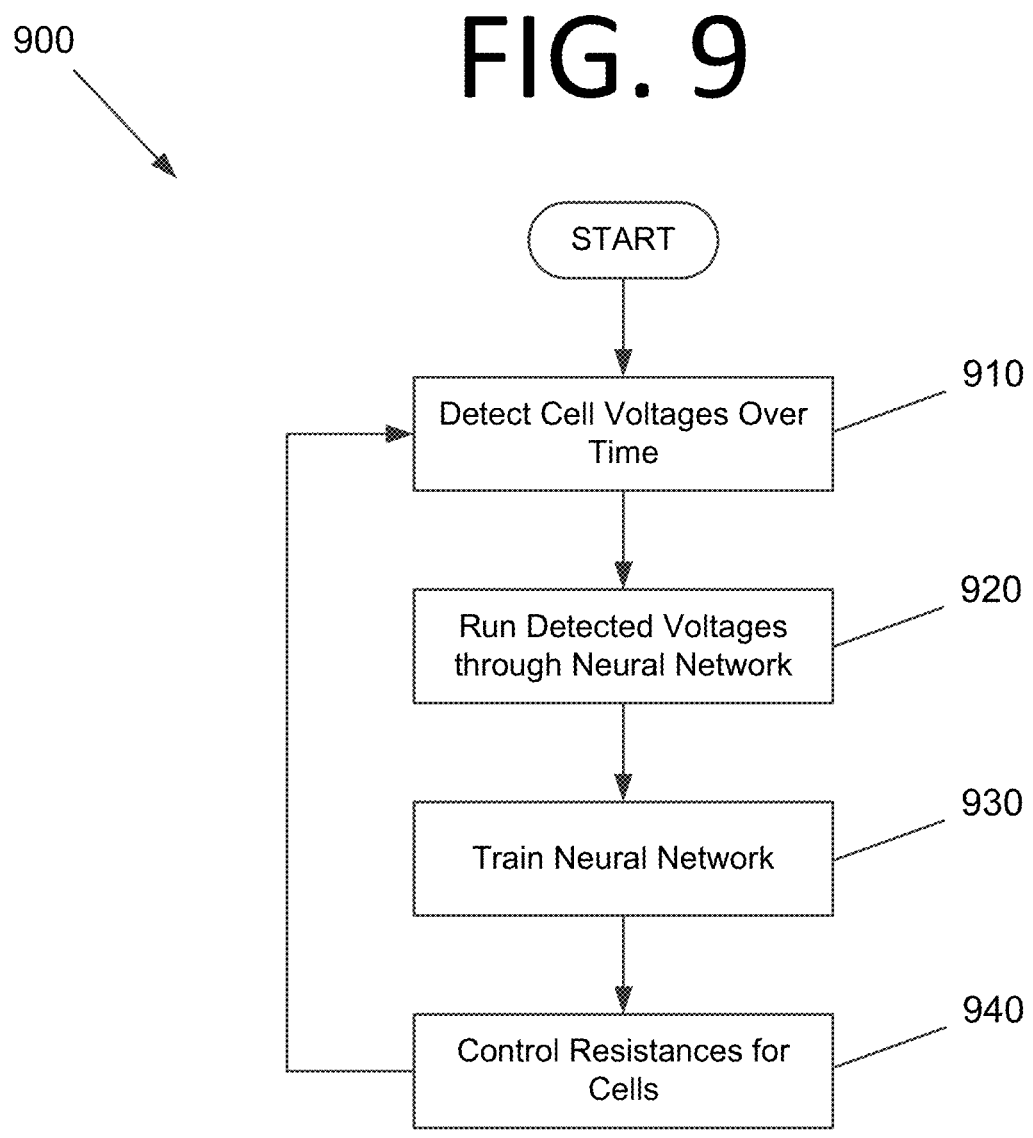
FIG. 9 is a flowchart illustrating a process for monitoring battery self-discharge and controlling battery cell resistances, according to an embodiment of the present invention.

FIG. 9 is a flowchart 900 illustrating a process for monitoring battery self-discharge and controlling battery cell resistances, according to an embodiment of the present invention. The process begins with detecting cell voltages for a plurality of battery cells overtime at 910. In some embodiments, the plurality of battery cells are lithium ion cells having self-discharge rates five orders of magnitude or more below normal operating currents of the plurality of battery cells. In certain embodiments, the plurality of battery cells are connected in series. In some embodiments, the plurality of battery cells include a plurality of series connected strings of battery cells that are connected in parallel to other strings of the series connected strings of battery cells. In certain embodiments, a respective neural network for each series connected string of battery cells in the plurality of battery cells.

The detected cell voltages are run through a neural network to detect cell-to-cell charge voltage imbalances between the plurality of battery cells while the plurality of battery cells are at peak charge voltages over a time window at 920. The neural network for the plurality of battery cells is trained using actual on times of the plurality of battery cells as input at 930. The neural network is configured to learn a resistor duty cycle for each respective resistor across the plurality of battery cells to balance self-discharge losses of the respective battery cell. In some embodiments, this includes monitoring the self-discharge rates of the plurality of battery cells while the plurality of battery cells are actively charging or discharging, via the neural network. Resistances are controlled across the plurality of battery cells at 940 to maintain voltage balance between the plurality of battery cells based on output from the neural network by turning respective resistors of the plurality of battery cells on and off based on a difference between a peak voltage of a respective cell and peak voltages of other battery cells of the plurality of battery cells.

In some embodiments, the neural network includes an LSTM network for each battery cell of the plurality of battery cells. The LSTM network is configured to learn a relative self-discharge rate of the respective battery cell. In certain embodiments, the LSTM network for each battery cell includes three LSTM neural network units, and each LSTM neural network unit includes an LSTM cell configured remember values over a time interval, an input gate, an output gate, and a forget gate. In some embodiments, a first memory unit of the three LSTM neural network units receives voltages of the respective battery cell and is configured to learn a present deviation of the received voltages from an average battery cell voltage for the plurality of battery cells over the time interval and output the learned present deviation, and the received voltages are provided from a telemetry stream of battery cell voltages from the plurality of battery cells in the battery system. In certain embodiments, a second memory unit of the three LSTM neural network units is configured to receive the present deviation of the received voltages from the average battery cell voltage of the plurality of battery cells over the time interval from the first memory unit, learn on and off times for the resistor for the respective battery cell to minimize the present deviation from the average battery cell voltage for the plurality of battery cells, and output the learned resistor on and off times. In some embodiments, a third memory unit of the three LSTM neural network units is configured to receive the learned resistor on and off times and learn a long-term duty cycle to match a self-discharge for the plurality of battery cells.

The process steps performed in FIG. 9 may be performed by computer program(s), encoding instructions for the processor(s) to perform at least part of the process(es) described in FIG. 9, in accordance with embodiments of the present invention. The computer program(s) may be embodied on non-transitory computer-readable media. The computer-readable media may be, but are not limited to, a hard disk drive, a flash device, RAM, a tape, and/or any other such medium or combination of media used to store data. The computer program(s) may include encoded instructions for controlling processor(s) of computing system(s) (e.g., processor(s) 810 of computing system 800 of FIG. 8) to implement all or part of the process steps described in FIG. 9, which may also be stored on the computer-readable medium.

The computer program(s) can be implemented in hardware, software, or a hybrid implementation. The computer program(s) can be composed of modules that are in operative communication with one another, and which are designed to pass information or instructions to display. The computer program(s) can be configured to operate on a general purpose computer, an ASIC, or any other suitable device.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A battery system, comprising:
   a battery comprising a plurality of battery cells, each cell of the plurality of battery cells having a resistor across the respective cell; and
   a computing system operably connected to the plurality of battery cells, the computing system comprising:
      memory storing computer program instructions for monitoring self-discharge in the battery cells, and
      at least one processor configured to execute the computer program instructions, wherein
   the computer program instructions are configured to cause the at least one processor to:
      detect cell voltages for the plurality of battery cells over time,
      run the detected cell voltages through a neural network to detect cell-to-cell charge voltage imbalances between the plurality of battery cells while the plurality of battery cells are at peak charge voltages over a time window, and
      control resistances across the plurality of battery cells to maintain voltage balance between the plurality of battery cells based on output from the neural network by turning respective resistors of the plurality of battery cells on and off based on a difference between a peak voltage of a respective cell and peak voltages of other battery cells of the plurality of battery cells.

2. The battery system of claim 1, wherein
   the plurality of battery cells are lithium ion cells having self-discharge rates five orders of magnitude or more below normal operating currents of the plurality of battery cells, and
   the computer program instructions are further configured to cause the at least one processor to monitor the self-discharge rates of the plurality of battery cells while the plurality of battery cells are actively charging or discharging, via the neural network.

3. The battery system of claim 1, wherein the plurality of battery cells are connected in series.

4. The battery system of claim 1, wherein the computer program instructions are further configured to cause the at least one processor to:
   train the neural network for the plurality of battery cells using actual on times of the plurality of battery cells as input, wherein
   the neural network is configured to learn a resistor duty cycle for each respective resistor across the plurality of battery cells to balance self-discharge losses of the respective battery cell.

5. The battery system of claim 1, wherein the plurality of battery cells comprise a plurality of series connected strings of battery cells that are connected in parallel to other strings of the series connected strings of battery cells.

6. The battery system of claim 5, wherein the computer program instructions comprise a respective neural network for each series connected string of battery cells in the plurality of battery cells.

7. The battery system of claim 1, wherein the neural network comprises a Long Short-Term Memory (LSTM) network for each battery cell of the plurality of battery cells, the LSTM network configured to learn a relative self-discharge rate of the respective battery cell.

8. The battery system of claim 7, wherein
   the LSTM network for each battery cell comprises three LSTM neural network units, and
   each of the three LSTM neural network units comprises an LSTM cell configured to remember values over a time interval, an input gate, an output gate, and a forget gate.

9. The battery system of claim 8, wherein
   a first memory unit of the three LSTM neural network units receives voltages of the respective battery cell and is configured to learn a present deviation of the received voltages from an average battery cell voltage for the plurality of battery cells over the time interval and output the learned present deviation, and
   the received voltages are provided from a telemetry stream of battery cell voltages from the plurality of battery cells in the battery system.

10. The battery system of claim 9, wherein a second memory unit of the three LSTM neural network units is configured to receive the present deviation of the received voltages from the average battery cell voltage of the plurality of battery cells over the time interval from the first memory unit, learn on and off times for the resistor for the respective battery cell to minimize the present deviation from the average battery cell voltage for the plurality of battery cells, and output the learned resistor on and off times.

11. The battery system of claim 10, wherein a third memory unit of the three LSTM neural network units is configured to receive the learned resistor on and off times and learn a long-term duty cycle to match a self-discharge for the plurality of battery cells.

12. A computer-implemented method, comprising:
   detecting cell voltages for a plurality of battery cells over time, by a computing system;
   running the detected cell voltages through a neural network to detect cell-to-cell charge voltage imbalances between the plurality of battery cells while the plurality of battery cells are at peak charge voltages over a time window, by the computing system; and

controlling resistances across the plurality of battery cells to maintain voltage balance between the plurality of battery cells based on output from the neural network by turning respective resistors across the plurality of battery cells on and off based on a difference between a peak voltage of a respective cell and peak voltages of other battery cells of the plurality of battery cells, by the computing system.

13. The computer-implemented method of claim 12, wherein the plurality of battery cells are lithium ion cells having self-discharge rates five orders of magnitude or more below normal operating currents of the plurality of battery cells and the method further comprises:

monitoring, by the computing system, the self-discharge rates of the plurality of battery cells while the plurality of battery cells are actively charging or discharging, via the neural network.

14. The computer-implemented method of claim 12, wherein the plurality of battery cells are connected in series.

15. The computer-implemented method of claim 12, further comprising:

training the neural network for the plurality of battery cells using actual on times of the plurality of battery cells as input, by the computing system, wherein the neural network is configured to learn a resistor duty cycle for each respective resistor across the plurality of battery cells to balance self-discharge losses of the respective battery cell.

16. The computer-implemented method of claim 12, wherein the plurality of battery cells comprise a plurality of series connected strings of battery cells that are connected in parallel to other strings of the series connected strings of battery cells, and the computing system comprises a respective neural network for each series connected string of battery cells in the plurality of battery cells.

17. The computer-implemented method of claim 12, wherein the neural network comprises a Long Short-Term Memory (LSTM) network for each battery cell of the plurality of battery cells, the LSTM network configured to learn a relative self-discharge rate of the respective battery cell, the LSTM network for each battery cell comprises three LSTM neural network units, and each of the three LSTM neural network units comprises an LSTM cell configured to remember values over a time interval, an input gate, an output gate, and a forget gate.

18. The computer-implemented method of claim 17, wherein a first memory unit of the three LSTM neural network units receives voltages of the respective battery cell and is configured to learn a present deviation of the received voltages from an average battery cell voltage for the plurality of battery cells over the time interval and output the learned present deviation, and the received voltages are provided from a telemetry stream of battery cell voltages from the plurality of battery cells in the battery system.

19. The computer-implemented method of claim 18, wherein a second memory unit of the three LSTM neural network units is configured to receive the present deviation of the received voltages from the average battery cell voltage of the plurality of battery cells over the time interval from the first memory unit, learn on and off times for the resistor for the respective battery cell to minimize the present deviation from the average battery cell voltage for the plurality of battery cells, and output the learned resistor on and off times.

20. The computer-implemented method of claim 19, wherein a third memory unit of the three LSTM neural network units is configured to receive the learned resistor on and off times and learn a long-term duty cycle to match a self-discharge for the plurality of battery cells.

21. A non-transitory computer-readable medium storing a computer program, wherein the computer program is configured to cause at least one processor to:

detect cell voltages for a plurality of battery cells over time;

run the detected cell voltages through a neural network comprising a Long Short-Term Memory (LSTM) network for each battery cell of the plurality of battery cells, the LSTM network configured to learn a relative self-discharge rate of the respective battery cell; and control resistances across the plurality of battery cells to maintain voltage balance between the plurality of battery cells based on output from the neural network by turning respective resistors across the plurality of battery cells on and off based on a difference between a peak voltage of a respective cell and peak voltages of other battery cells of the plurality of battery cells.

22. The non-transitory computer-readable medium of claim 21, wherein the plurality of battery cells are lithium ion cells having self-discharge rates five orders of magnitude or more below normal operating currents of the plurality of battery cells and the computer program is further configured to cause the at least one processor to:

monitor the self-discharge rates of the plurality of battery cells while the plurality of battery cells are actively charging or discharging, via the neural network.

23. The non-transitory computer-readable medium of claim 21, wherein the computer program is further configured to cause the at least one processor to:

train the neural network for the plurality of battery cells using actual on times of the plurality of battery cells as input, wherein the neural network is configured to learn a resistor duty cycle for each respective resistor across the plurality of battery cells to balance self-discharge losses of the respective battery cell.

24. The non-transitory computer-readable medium of claim 21, wherein the LSTM network for each battery cell comprises three LSTM neural network units, each of the three LSTM neural network units comprises an LSTM cell configured to remember values over a time interval, an input gate, an output gate, and a forget gate, a first memory unit of the three LSTM neural network units receives voltages of the respective battery cell and is configured to learn a present deviation of the received voltages from an average battery cell voltage for the plurality of battery cells over the time interval and output the learned present deviation, and the received voltages are provided from a telemetry stream of battery cell voltages from the plurality of battery cells in the battery system.

25. The non-transitory computer-readable medium of claim 24, wherein a second memory unit of the three LSTM neural network units is configured to receive the present deviation of the received voltages from the average battery cell voltage of the plurality of battery cells over the time interval from the first memory unit, learn on and off times for the resistor for the respective battery cell to minimize the present deviation from the average battery cell voltage for the plurality of battery cells, and output the learned resistor on and off times.

26. The non-transitory computer-readable medium of claim 25, wherein a third memory unit of the three LSTM neural network units is configured to receive the learned resistor on and off times and learn a long-term duty cycle to match a self-discharge for the plurality of battery cells.

* * * * *